(12) United States Patent
Aliev et al.

(10) Patent No.: US 9,304,859 B2
(45) Date of Patent: Apr. 5, 2016

(54) POLAR CODES FOR EFFICIENT ENCODING AND DECODING IN REDUNDANT DISK ARRAYS

(71) Applicant: EMC Corporation, Hopkinton, MA (US)

(72) Inventors: Artem Alexandrovich Aliev, St. Petersburg (RU); Vera Dmitriyevna Miloslavskaya, St. Petersburg (RU); Peter Vladimirovich Trifonov, St. Petersburg (RU)

(73) Assignee: EMC Corporation, Hopkinton, MA (US)

( * ) Notice: Subject to any disclaimer, the term of this patent is extended or adjusted under 35 U.S.C. 154(b) by 57 days.

(21) Appl. No.: 14/122,404

(22) PCT Filed: Dec. 29, 2012

(86) PCT No.: PCT/IB2012/003084
§ 371 (c)(1),
(2) Date: Jul. 22, 2014

(87) PCT Pub. No.: WO2014/102565
PCT Pub. Date: Jul. 3, 2014

(65) Prior Publication Data
US 2014/0331083 A1    Nov. 6, 2014

(51) Int. Cl.
*G06F 11/00* (2006.01)
*G06F 11/10* (2006.01)
(Continued)

(52) U.S. Cl.
CPC .......... *G06F 11/108* (2013.01); *G06F 11/2058* (2013.01); *H03M 13/13* (2013.01); *G06F 2211/1009* (2013.01)

(58) Field of Classification Search
CPC .................................................... G06F 11/108
USPC ............... 714/6.22, 6.23, 6.24, 6.3, 767, 769, 714/770, 772
See application file for complete search history.

(56) References Cited

U.S. PATENT DOCUMENTS

| 6,039,158 | A | * | 3/2000 | Fox | B60L 7/00 188/162 |
| 6,460,158 | B1 | * | 10/2002 | Baggen | H03M 13/05 714/752 |

(Continued)

FOREIGN PATENT DOCUMENTS

KR    20120054571 A    5/2012

*Primary Examiner* — Dieu-Minh Le
(74) *Attorney, Agent, or Firm* — BainwoodHuang

(57) ABSTRACT

An improved technique applies polar codes to storage data to improve the reliability of a storage system that uses high-performance, solid-state disks as part of a RAID group for storing frequently-accessed data. Along these lines, a high-performance storage system having n solid-state disks assigns k of those disks as payload disks. The storage system partitions the payload data into a data vector that has k data symbols. The storage system then applies, to the k payload symbols, a (n, k) polar code generator matrix derived from k rows of the ⌈$\log_2 n$⌉-times Kronecker product of the matrix $$\begin{pmatrix} 1 & 0 \\ 1 & 1 \end{pmatrix}$$

to produce n encoded symbols and stores each of the encoded payload symbols in a solid-state disk of the RAID group.

20 Claims, 9 Drawing Sheets

(51) Int. Cl.
*G06F 11/20* (2006.01)
*H03M 13/13* (2006.01)

(56) References Cited

U.S. PATENT DOCUMENTS

| | | | |
|---|---|---|---|
| 7,219,289 | B2 | 5/2007 | Dickson |
| 8,181,090 | B1 | 5/2012 | Corbett et al. |
| 8,594,217 | B2 | 11/2013 | Fanous et al. |
| 2011/0310832 | A1 | 12/2011 | Hammarwall et al. |
| 2013/0111291 | A1* | 5/2013 | Ma .................. H04L 1/0009 714/752 |
| 2014/0208183 | A1* | 7/2014 | Mandavifar ........ H03M 13/296 714/755 |
| 2014/0380114 | A1* | 12/2014 | Alexeev ............ H03M 13/2906 714/755 |

* cited by examiner

Systematic Encoding

Final encoded symbols 70

Information Symbols   Check Symbols $$c_{i,k_i+1..N} = V^{(1)^{-1}}_{i,i..v} c_{i..v,1..k_i} B^{(i)}$$
$$\qquad - V^{(1)^{-1}}_{i,i+1..v} c_{i+1..v,k_i+1..N}$$

$i = v..1$ $c_{3,4} = c_{3,1} + c_{3,2} + c_{3,3} + c_{4,1} + c_{4,2} + c_{4,3} - c_{4,4}$ $c_{2,3} = c_{2,1} + c_{2,2} + c_{4,1} + c_{4,2} - c_{4,3}$ $c_{2,4} = c_{2,2} + c_{4,2} - c_{4,4}$ $c_{1,2} = c_{1,1} + c_{2,1} - c_{2,2} + c_{3,1} - c_{3,2} + c_{4,1} - c_{4,2}$ $c_{1,3} = c_{1,1} + c_{2,1} - c_{2,3} + c_{3,1} - c_{3,3} + c_{4,1} - c_{4,3}$ $c_{1,4} = c_{1,1} + c_{2,1} - c_{2,4} + c_{3,1} - c_{3,4} + c_{4,1} - c_{4,4}$

120

After generating the v x N matrix of final encoded symbols, obtaining a set of information symbols to be updated  122

For each information symbol of the set of information symbols to be updated, producing a difference between a current value of the information symbol and an updated value of the information symbol  124

Generating check symbols for an array having elements that include the difference between a current value of the information symbol and an updated value of the information symbol Forming a generator submatrix from rows of the polar code generator matrix corresponding to indices of the set of information symbols to be updated  128

Multiplying an array of information symbols to be updated by the generator submatrix  130

Encoding an array of information symbols to be updated by Equation (*), then reading values of check symbols from the disks, computing difference between them and values of check symbols from encoding, and writing this difference on the disks.  132

POLAR CODES FOR EFFICIENT ENCODING AND DECODING IN REDUNDANT DISK ARRAYS

BACKGROUND

Some storage systems have configurations that use fast solid-state disks (e.g., Flash drives), to store frequently-accessed data in order to increase access speed to such frequently-accessed data nominally stored on disk drives. FAST Cache, a technology made available by EMC Corp., is an example of such a configuration. The solid-state disks are typically placed in a path between a hard disk and a DRAM cache in the storage system. In this way, the storage system can also use the solid-state disks as a place to offload data from the DRAM cache with a reduced penalty in access time from moving such data to the hard disk.

While such configurations achieve high performance, Redundant Arrays of Independent Disks (RAID) are commonly used to provide high reliability access to large amounts of data storage. There are several types of RAID, ranging from simpler RAID 0 and RAID 1 (data mirroring) through more complex RAID 5 and RAID 6. RAID 5 encodes stripes of data across a plurality of disks with one disk (which rotates from stripe to stripe) storing a parity redundancy code for that stripe, which allows stored data to be recovered even in the event of a disk failure. This parity code involves performing a compound exclusive-or (XOR) operation on corresponding blocks on the different disks. RAID 6 employs a similar approach, but using two redundancy disks, allowing stored data to be recovered even in the event of two disk failures. There are several ways of calculating the values stored on the redundancy disks for RAID 6, such as even-odd parity (which involved storing row parity on one disk and diagonal parity on another disk) and Reed-Solomon encoding.

SUMMARY

In some cases, the reliability of high performance storage systems such as those described above is improved with using a RAID configuration. While maximum distance separable codes such as Reed-Solomon codes found in RAID 6 are efficient in that they minimize the number of parity disks required for a given level of redundancy, encoding and decoding of such codes is typically too complex in high-performance storage systems such as FAST cache. Rather, for reliability, a conventional storage system employing FAST cache arranges the solid-state disks in a simpler RAID 1 array. In this way, the storage system maintains its high performance while improving reliability.

Unfortunately, there are deficiencies with the conventional storage system employing FAST cache. For example, RAID 1 results in a payload capacity that is only 50% of the physical disk space. Also, there is empirical evidence that the reliability of RAID 1 is not sufficient for systems employing such high-performance disks.

In contrast to the conventional storage system employing FAST cache which uses a relatively unreliable, high-cost redundancy scheme, an improved technique applies polar codes to storage data to improve the reliability of a storage system that uses high-performance solid-state disks as part of a RAID group for storing frequently-accessed data. Along these lines, a high-performance storage system having n solid-state disks assigns k of those disks as payload disks. The storage system partitions the payload data into a data vector that has k data symbols. The storage system then applies, to the k payload symbols, a (n, k) polar code with generator matrix derived from k rows of the $\lceil \log_2 n \rceil$-times Kronecker product of the matrix $$\begin{pmatrix} 1 & 0 \\ 1 & 1 \end{pmatrix}$$

with itself. For the case of systematic encoding, generator matrix is reduced to the canonical form containing a k×k identity submatrix on some positions, which is used to produce n encoded symbols from k original ones, and stores each of the encoded payload symbols in a solid-state disk of the RAID group.

Advantageously, the improved technique involves a reduced complexity encoding method for the high-performance disks, while still using fewer parity disks than simple codes like RAID-1. Decoding and partial stripe update operations on the encoded data also have reduced complexity. The reduced number of parity disks involved in using polar codes stems from the fact that polar codes can achieve the theoretical capacity of a binary input output symmetric memoryless channel. By splitting such a channel into n subchannels, it can be shown that, when the capacity of the channel is k/n, k of those subchannels will be noise-free for large values of n. Thus, encoding with polar codes requires fewer extra subchannels, or in the case of storage, parity disks. Further, by using a systematic generalized concatenated code (GCC) formulation of polar codes, the encoding complexity is further reduced by approximately a factor of 2 (for the case of high-rate codes) compared to other encoding algorithms for polar codes.

One embodiment of the improved technique is directed to a method of reliably storing data within a storage system having high-performance solid-state disks arranged as part of a RAID group having n solid-state disks of which k solid-state disks are payload disks. The method includes partitioning the payload data into a data vector that includes k data symbols. The method further includes applying an (n, k) polar code generator matrix to the payload vector to produce a code vector that includes n encoded symbols, the (n, k) polar code generator matrix including exactly k rows of an n×n matrix that is derived from $\lceil \log_2 n \rceil$-times Kronecker product of a 2×2 polar seed matrix with itself. The method further includes storing each of the n encoded symbols of the codeword in a solid-state disk of the RAID group.

Additionally, some embodiments of the improved technique are directed to an apparatus constructed and arranged to reliably store data within a storage system having high-performance solid-state disks arranged as part of a RAID group having n solid-state disks of which k solid-state disks are payload disks. The apparatus includes a network interface, memory, and a controller including controlling circuitry constructed and arranged to carry out the method of reliably storing data within a storage system having high-performance solid-state disks arranged as part of a RAID group having n solid-state disks of which k solid-state disks are payload disks.

Furthermore, some embodiments of the improved technique are directed to a computer program product having a non-transitory computer readable storage medium which stores code including a set of instructions to carry the method of reliably storing data within a storage system having high-performance solid-state disks arranged as part of a RAID group having n solid-state disks of which k solid-state disks are payload disks.

BRIEF DESCRIPTION OF THE DRAWING

The foregoing and other objects, features and advantages will be apparent from the following description of particular embodiments of the invention, as illustrated in the accompanying figures in which like reference characters refer to the same parts throughout the different views.

FIG. 8 is a flow chart illustrating an example method of updating information symbols and corresponding check symbols of a codeword of a systematic polar code within the electronic environment shown in FIG. 1a and FIG. 1b.

DETAILED DESCRIPTION

An improved technique applies polar codes to storage data to improve the reliability of a storage system that uses high-performance solid-state disks as part of a RAID group for storing frequently-accessed data. Along these lines, a RAID group having n solid-state disks assigns k of those disks as payload disks. The storage system partitions the payload data into a data vector that has k data symbols. The storage system then applies, to the k payload symbols, a (n, k) polar code generator matrix derived from k rows of the $\lceil \log_2 n \rceil$-times Kronecker product of the matrix $$\begin{pmatrix} 1 & 0 \\ 1 & 1 \end{pmatrix}$$

with itself to produce n encoded symbols and stores each of the encoded payload symbols in a solid-state disk of the RAID group.

Advantageously, the improved technique involves a reduced complexity encoding for the high-performance disks, while still using fewer parity disks than simple codes like RAID-1. Decoding and partial stripe update operations on the encoded data also have reduced complexity. The reduced number of parity disks involved in using polar codes stems from the fact that polar codes can achieve the theoretical capacity of a binary input output symmetric memoryless channel. By splitting such a channel into n subchannels, it can be shown that, when the capacity of the channel is k/n, k of those subchannels will be noise-free for large values of n. In this case the number of parity disks, which is equal to the number of frozen subchannels, is minimal possible for reliable system with k payload disks. Further, by using a systematic encoding algorithm developed for generalized concatenated code (GCC) formulation of polar codes, the encoding complexity is reduced by approximately a factor of 2 (for the case of high-rate codes) compared to other encoding algorithms for polar codes.

Figure 1A:
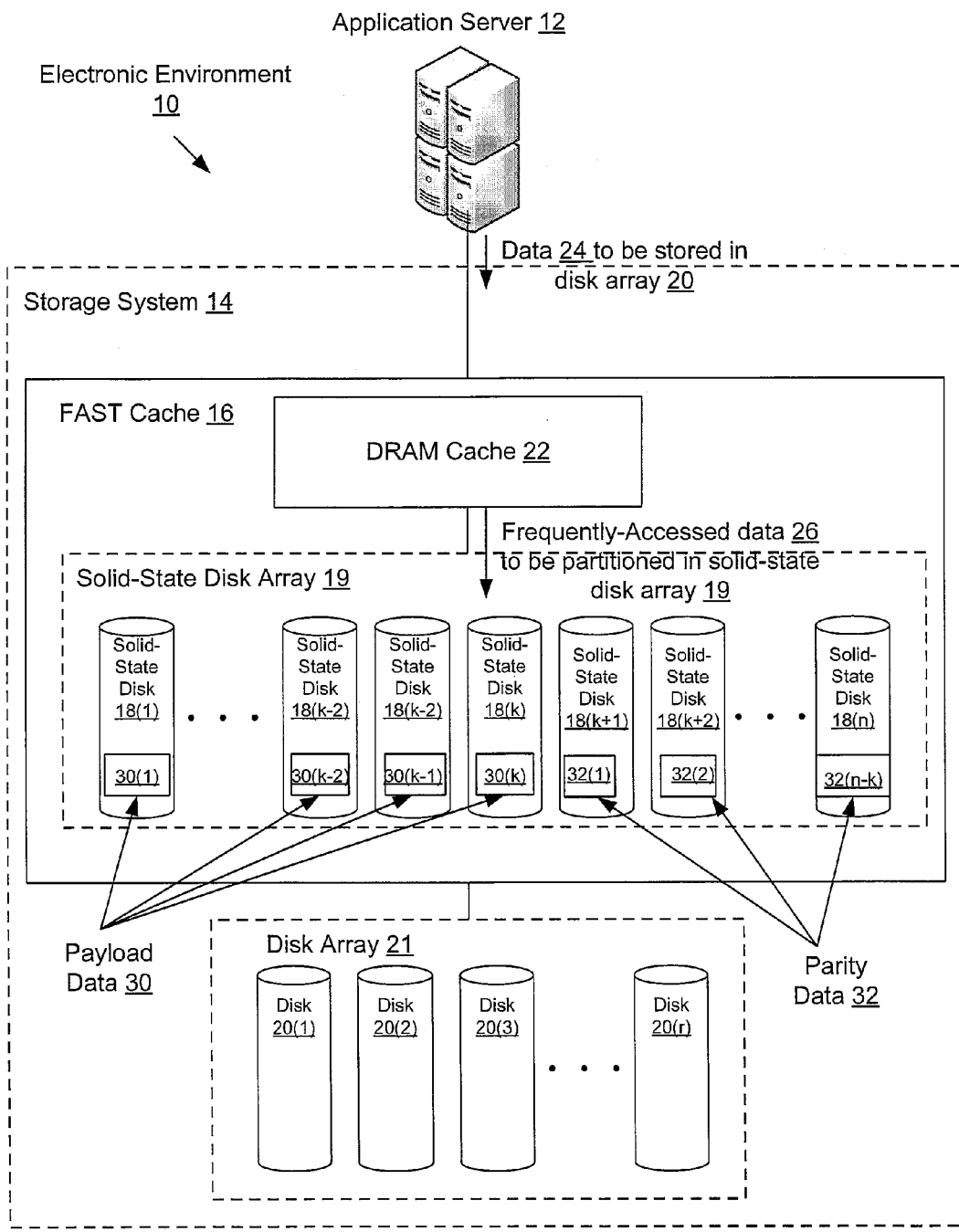
FIG. 1a is a block diagram illustrating an example electronic environment for carrying out the improved technique.

FIG. 1a illustrates an electronic environment 10 for carrying out the improved technique. Electronic environment 10 includes application server 12 and storage system 14.

Application server 12 is configured to store data in storage system 14. Application server 12 is a server system. In some arrangements, however, application server 12 is a desktop personal computer, a laptop personal computer, a tablet computer, a smart phone, or any other electronic device that is enabled to store data in storage system 14.

Storage system 14 is configured to store data 24 from application server 12 in disk array 20. Storage system 12 is further configured to store frequently-accessed data 26 in solid-state disk array 19 and apply polar codes for encoding and decoding data and updating partial stripes. Storage system 14 includes solid-state disk array 19, disk array 21, and DRAM cache 22.

Disk array 21 includes disks 20(1), 20(2), 20(3), ..., 20(r). Each disk of disk array 21 is a hard disk drive such a magnetic disk drive, although other types of disks are possible (e.g., slow Flash, optical disk). In some arrangements, disk array 21 is a RAID.

Solid-state disk array 19 takes the form of a set of flash drives 18(1), ..., 18(k-2), 18(k-1), 18(k), 18(k+1), 18(k+2), ..., 18(n).

DRAM cache 22 is configured to provide very fast access to a small subset of data 24. DRAM cache 22 is also configured to send data to solid-state disk array 19 and/or disk array 21 when that data is no longer in sufficiently active use by storage system 14.

During operation, application server 12 sends data 24 to disk array 21 for storage. Over time, storage system recognizes data 26 that has been frequently accessed by application server 12. Storage system 14 then moves data 26 to solid-state disk array 19 for fast access.

It should be understood that storage system 14 splits data 26 into a set of k symbols to be stored among the n solid-state disks of array 19. Each symbol includes a set of characters chosen from a fixed alphabet which represents a portion of data 26. A code includes a lexicon of codewords of length n consisting of such characters, and as such is characterized by a minimum distance between distinct codewords of the lexicon. For the purposes of the discussion below, the alphabet of the codes are taken from the set {0,1}.

It should be understood that the disks within a storage system are characterized by failure probability. The linear transformation Oven by $F^{\otimes s}$, where $\otimes$ s represents s-times Kronecker product of a matrix, $$F = \begin{pmatrix} 1 & 0 \\ 1 & 1 \end{pmatrix},$$

and $s=\lceil \log_2 n \rceil$, induces n subchannels, which are characterized by substantially different erasure probabilities. Let A be the set of subchannels with the smallest erasure probability. The non-systematic generator matrix G' of a polar code is obtained by taking the rows of $F^{\otimes s}$ with indices in A. By applying elementary row operations to matrix G', it is possible to obtain a systematic generator matrix G for the same code, which contains an identity submatrix in columns given by A. Such systematic generator matrix is advantageous from the application point of view, since it enables one to partition the codeword into information symbols, which correspond to the payload data, and parity symbols, which are used to recover the payload data if some of the disks fail.

It should further be understood that the arrangement of the solid-state disks of array 19 are shown as in FIG. 1*a* for simplicity and do not necessarily represent the particular placement of payload and parity data within array 19. For the purpose of discussion below, the payload data has indices taken from a set A, which is a set of k indices taken from the set {1 . . . n} and corresponding to the subchannels with the lowest probabilities of decoding failure.

Figure 1B:
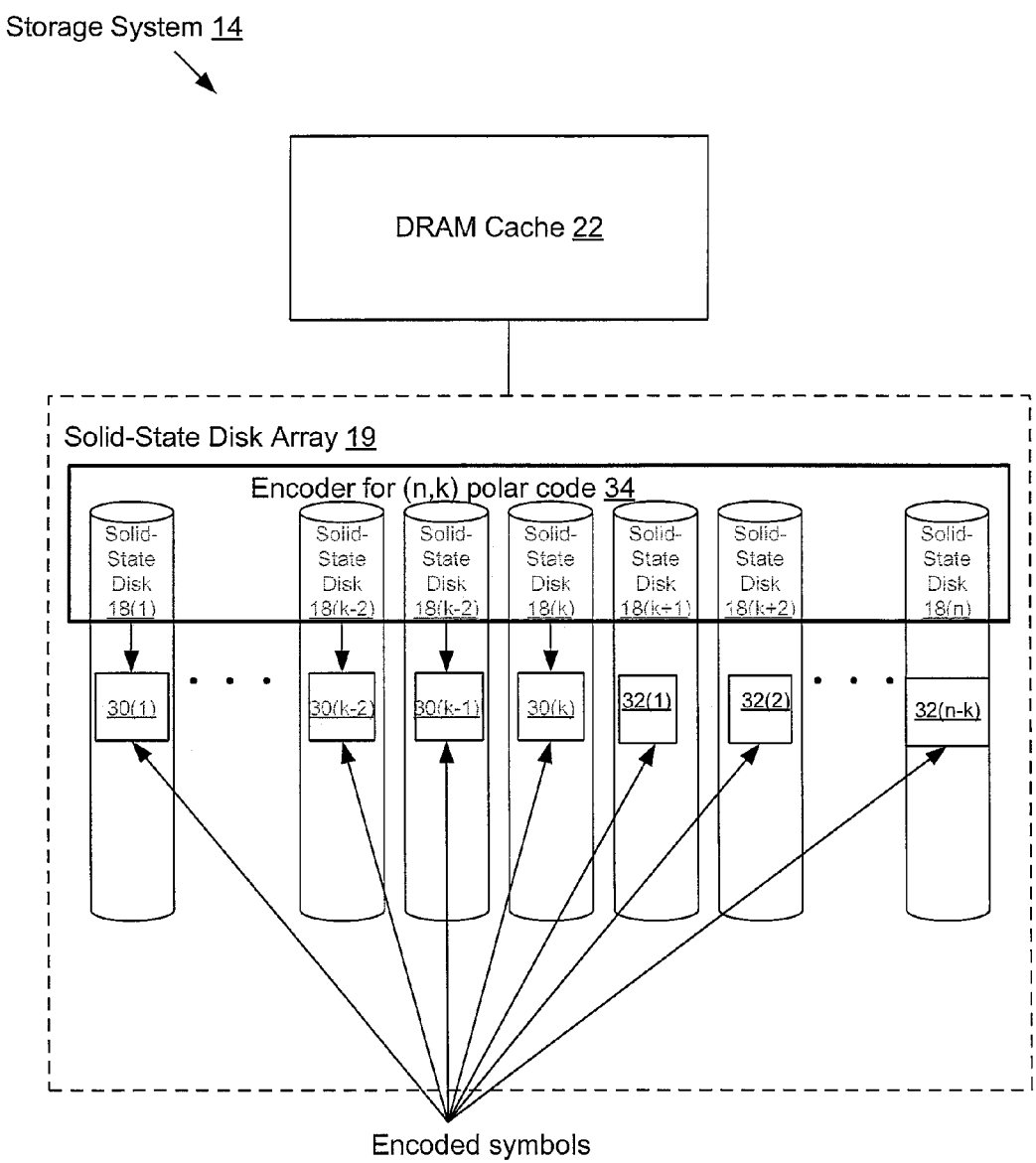
FIG. 1b is a block diagram illustrating an example electronic environment for carrying out the improved technique.

FIG. 1*b* illustrates electronic environment 10 after the application of a (n, k) polar code to payload data 30. The (n, k) polar code has a generator matrix 34 that consists of k rows of the matrix $F^{\otimes s}$, where ⊗ s represents s-times Kronecker product of a matrix with itself $$F = \begin{pmatrix} 1 & 0 \\ 1 & 1 \end{pmatrix}$$

and s=⌈$\log_2$ n⌉. The k rows are those rows having indices in A. For example, a (8,5) polar code generator matrix takes the form $$G' = \begin{pmatrix} 1 & 1 & 0 & 0 & 0 & 0 & 0 & 0 \\ 1 & 1 & 1 & 1 & 0 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{pmatrix}.$$

In this case, the set A={1, 2, 3, 5, 7}.

Storage system 14 applies a k×n generator matrix in canonical form of polar code 34 such as $$G = MG' = \begin{pmatrix} 1 & 0 & 0 & 1 & 0 & 1 & 0 & 1 \\ 0 & 1 & 0 & 1 & 0 & 1 & 0 & 1 \\ 0 & 0 & 1 & 1 & 0 & 0 & 0 & 0 \\ 0 & 0 & 0 & 0 & 1 & 1 & 0 & 0 \\ 0 & 0 & 0 & 0 & 0 & 0 & 1 & 1 \end{pmatrix}$$

to a 1×k row vector of payload data 30 to obtain a set of n encoded symbols containing n−k 32 check symbols on the positions {1 . . . n}\A. Storage system 14 stores encoded symbols 30 and 32 in solid-state disk array 19.

It should be understood that the formulation for deriving encoded symbols 30 and 32 as described above does not result in the most efficient storage scheme. Details of alternative schemes for applying polar codes to data 26 are described below with respect to FIGS. 4 and 5.

Further details of storage system 14 are described below with respect to FIG. 2.

Figure 2:
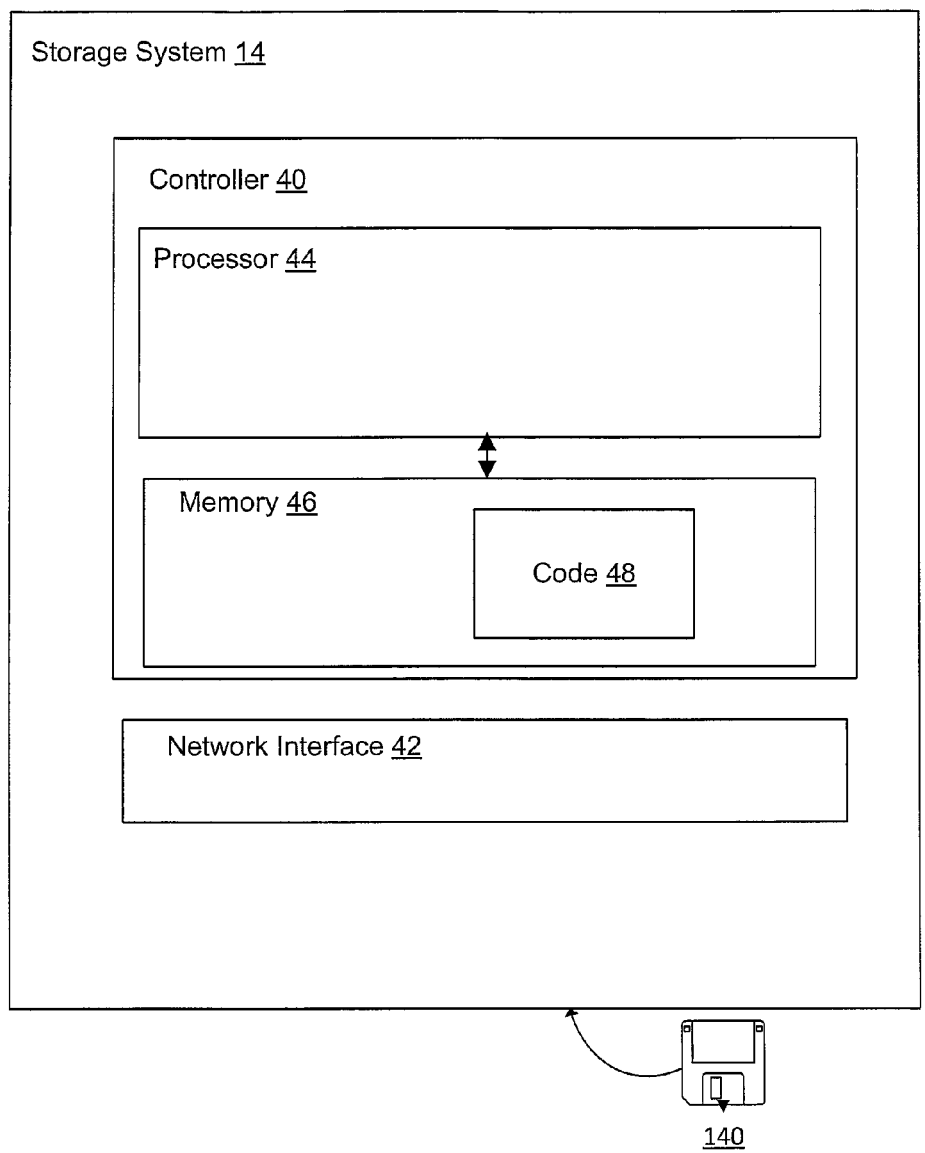
FIG. 2 is a block diagram illustrating an example storage system within the electronic environment shown in FIG. 1a and FIG. 1b.

FIG. 2 illustrates details of an example storage system 14 (see FIG. 1*a*). Storage system 14 includes controller 40, which in turn includes processor 44 and memory 46, and network interface 42. It should be understood that storage system 14 also includes other elements as described above with respect to FIG. 1*a* and FIG. 1*b*.

Network interface 42 takes the form of an Ethernet card; in some arrangements, network interface 42 takes other forms including a wireless receiver and a token ring card.

Memory 46 is configured to store code 48 that contains instructions configured to cause the processor to carry out the improved technique. Memory 46 generally takes the form of, e.g., random access memory, flash memory or a non-volatile memory.

Processor 44 takes the form of, but is not limited to, Intel or AMD-based MPUs, and can include a single or multi-cores each running single or multiple threads. In some arrangements, processor 44 is one of multiple processors working together.

Figure 3:
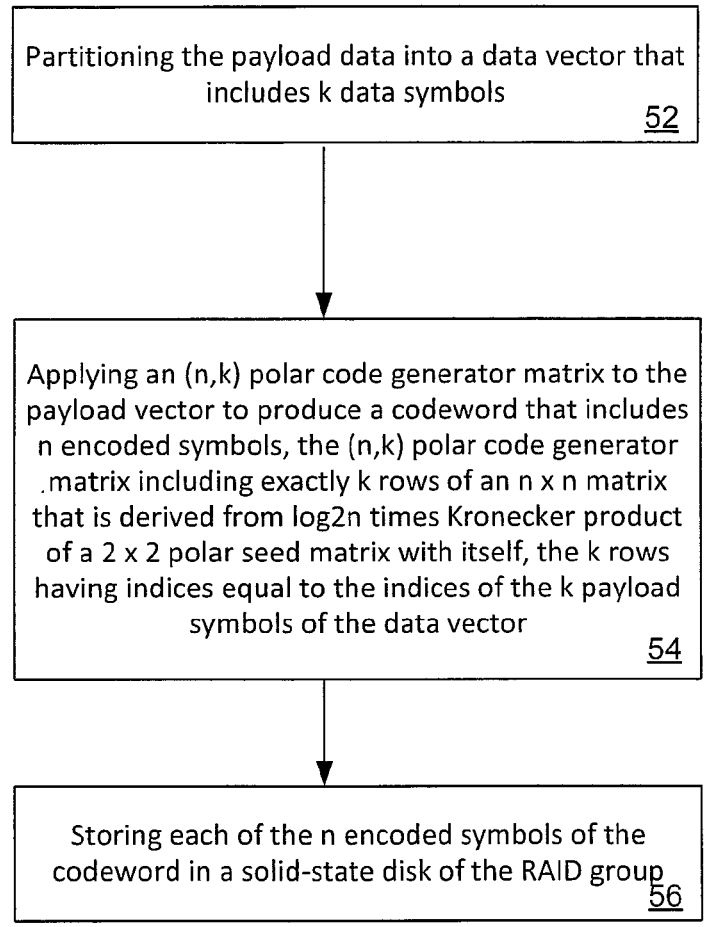
FIG. 3 is a flow chart illustrating an example method of carrying out the improved technique within the electronic environment shown in FIG. 1a and FIG. 1b.

FIG. 3 illustrates an example method 50 of reliably storing data within a storage system having high-performance solid-state disks arranged as part of a RAID group having n solid-state disks of which k solid-state disks are payload disks, including steps 52, 54 and 56. In step 52, the payload data is partitioned into a vector that includes k data symbols. In step 54, an (n, k) polar code generator matrix is applied to the payload vector to produce a vector that includes n encoded symbols, the (n, k) polar code generator matrix including exactly k rows of an n×n matrix that is derived from ⌈$\log_2$ n⌉ times Kronecker product of a 2×2 polar seed matrix F with itself. In step 56, each of the n encoded symbols of obtained vector is stored in a solid-state disk of the RAID group.

Further details of applying polar codes to encode data 26 are discussed below with respect to FIGS. 4 and 5.

Figure 4:
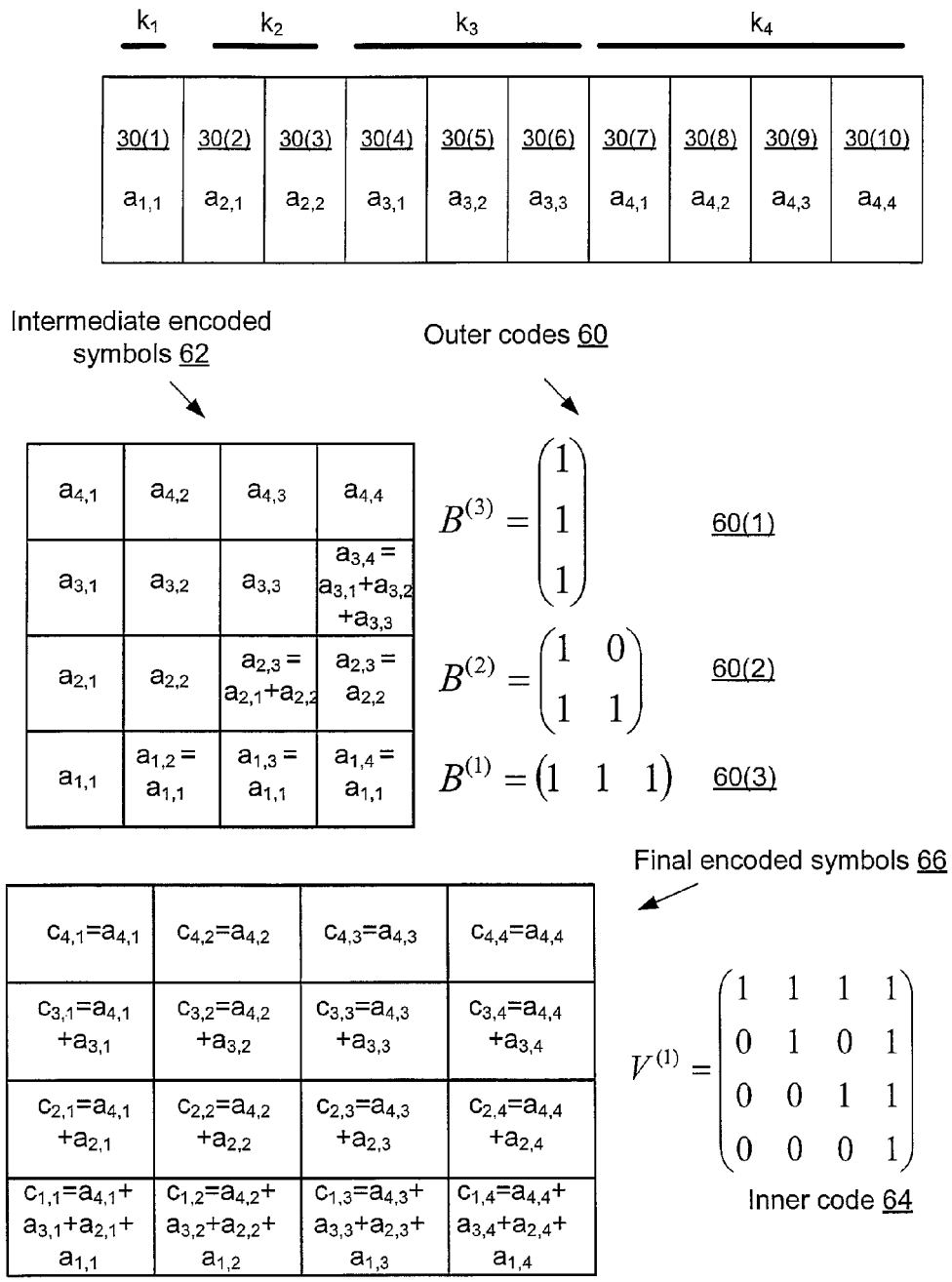
FIG. 4 is a block diagram illustrating an example encoding scheme using a polar code within the electronic environment shown in FIG. 1a and FIG. 1b.

FIG. 4 illustrates an example procedure for encoding data 26 (see FIG. 1*a*). This procedure corresponds to a non-systematic encoding of data 26 using a generalized concatenated code (GCC) representation of a (16,10) polar code. An advantage of such a representation is a reduced complexity of encoding with respect to a direct representation of a polar code as described above.

A GCC representation of a (n, k) polar code having a generator matrix G involves decomposing a vector of the k payload data symbols 30 into v subvectors, each of length $k_i$, 1≤i≤v, such that $\Sigma_{1 \leq i \leq v} k_i = k$.

For example, consider a vector of data 30 arranged as illustrated in FIG. 4. Processor 44 (see FIG. 2) splits the vector of data 30 having 10 elements into v=4 subvectors such that $k_1$=1, $k_2$=2, $k_3$=3, and $k_4$=4. Processor 44 then arranges each subvector into a row of an array of intermediate encoded symbols 62.

It should be understood that there are several ways of splitting the vector of data 30 into subvectors. For example, processor 44 could arrange vector of data 30 into 2 rows, or 8 rows. If the number of rows is v=$2^l$, then the decomposition is said to be of order l.

A GCC decomposition of order l of G' follows from the identity $F^{\otimes s} = F^{\otimes s} \otimes F^{\otimes \ell}$. That is, a GCC can be split into a set of (N,$k_i$) outer codes $C_i$, 1≤i≤v and N=$2^{s-l}$, and (v,v−i+1) nested inner codes $\mathbb{C}_i$. The outer codes $C_i$ and the inner codes $\mathbb{C}_i$ are each examples of polar codes.

Each outer code $C_i$ operates on a subvector of data 30 within a row of the array of intermediate symbols 62 to produce the rest of the elements of that row. For an l=2 decomposition, the resulting array of intermediate symbols 62 has dimension 4×4. In the array of intermediate symbols, the first row has one element from the vector of data 30, so that the outer code generator matrix for that row needs to produce three additional entries. The outer code $C_1$ in this case has 1×4 generator matrix, which contains as submatrix the following check symbols generator matrix $B^{(1)}=(1\ 1\ 1)$; this implies that the subsequent elements of the first row are equal to the first element, as illustrated in FIG. 4. Outer code $C_2$ has check symbols generator matrix $$\mathcal{B}^{(2)} = \begin{pmatrix} 1 & 0 \\ 1 & 1 \end{pmatrix};$$

outer code $C_3$ has check symbols generator matrix $$\mathcal{B}^{(3)} = \begin{pmatrix} 1 \\ 1 \\ 1 \end{pmatrix}.$$

Note that, because the fourth row is filled with data, there is no outer code needed there.

It should be understood that the lengths of the subvectors, i.e. dimensions of outer codes $k_i$, may not be arranged in ascending order after decomposition of polar code. In such a case, generator matrix for the first inner code may not form a lower-triangular matrix. Such a low triangular matrix is desirable in the case of systematic encoding, as will be seen with respect to FIG. 5 below. In order to ensure such a structure, processor 44 would apply to row- and column-swapping matrix to the generator matrix of the first inner code. It induces ascending order of dimensions of outer codes.

Once the processor fully forms the array of intermediate encoded symbols 62, processor 44 then applies a v×v transposed generator matrix of the first inner code 64 to the array of intermediate encoded symbols 62 to produce the n=Nv final encoded symbols 66 stored in a v×N array.

Inner code $\mathbb{C}_1$ is generated by a permutation matrix multiplied by $F^{\otimes \ell}$ so that the transposed generator matrix $64\,V^{(1)}$ of inner code $\mathbb{C}_1$ is upper triangular. In the case illustrated in FIG. 4, $$V^{(1)} = \begin{pmatrix} 1 & 1 & 1 & 1 \\ 0 & 1 & 0 & 1 \\ 0 & 0 & 1 & 1 \\ 0 & 0 & 0 & 1 \end{pmatrix}.$$

The result of multiplying the array 62 by $V^{(1)}$ 64 results in the array of final encoded symbols 66 illustrated in FIG. 4. Processor 44 then stores each element of array 66 in storage array 19 (see FIG. 1a) to complete this encoding scheme using a GCC representation of a polar code.

It should be understood that the final encoded symbols 66 are different from the data symbols 30. In this case, a reading of the payload data may require more complexity than one in the case of systematic encoding. In a systematic code, the encoded symbols include the original data symbols in addition to some check symbols. Such a systematic encoding for polar codes is discussed below with respect to FIG. 5.

Figure 5:
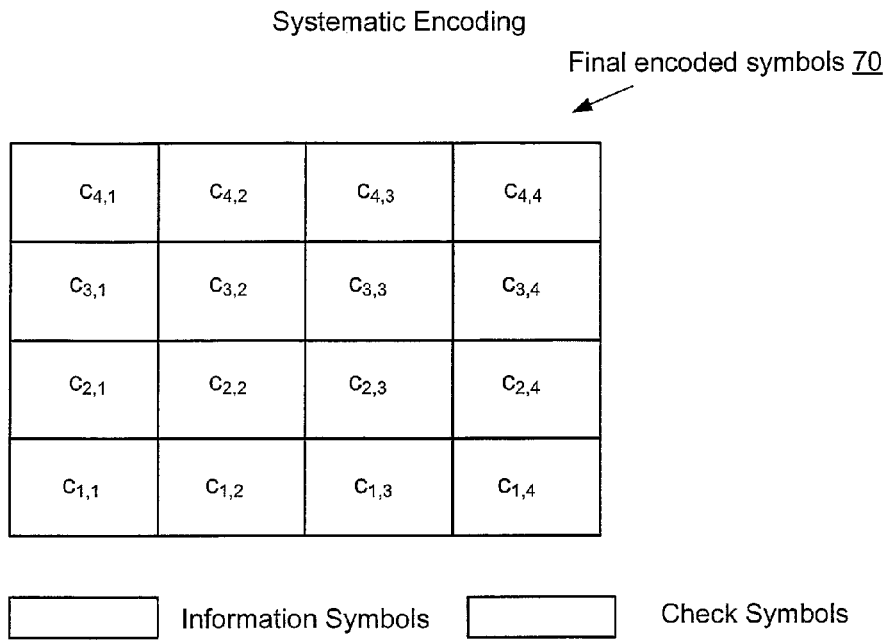
FIG. 5 is a block diagram illustrating an example encoding scheme using a systematic polar code within the electronic environment shown in FIG. 1a and FIG. 1b.

FIG. 5 illustrates an example procedure for encoding data 26 using a systematic polar code. In this procedure, an array of final encoded symbols 70 is constructed in a similar manner as the array of intermediate symbols 66, with the data symbols 30 being arranged in each row according to the values of the $k_i$. The procedure involves generating check symbols in array 70.

Consider a representation of the $i^{th}$ outer code generator matrix in the canonical form $(I\ B^{(i)})$, where I is the $k_i \times k_i$ identity matrix, and $B^{(i)}$ is a $k_i \times (N-k_i)$ check symbols generator matrix. By considering the construction of the array intermediate symbols and array of final encoded symbols from the above example, one can show that processor 44 may generate the check symbols of the array of final encoded symbols 70 according to the following expression:

$$c_{i,k_i+1\ldots N} = V^{(1)^{-1}}_{i,i}\ldots v c_{i\ldots v,1\ldots k_i} B^{(i)} - V^{(1)^{-1}}_{i,i+1}\ldots v c_{i+1\ldots v, k_i+1\ldots N},\ i = v\ldots 1, \quad (*)$$

where $c_{i,j}$ is the element of the array of final encoded symbols 70 in the $i^{th}$ row and $j^{th}$ column, $c_{i_1\ldots i_2, j_1\ldots j_2}$ represents a subarray that includes the $i_1^{th}$ through the $i_2^{th}$ rows and the $j_1^{th}$ through the $j_2^{th}$ columns of array 70, $V^{(1)^{-1}}$ represents the inverse of $V^{(1)}$, and $V^{(1)^{-1}}_{i,j_1\ldots j_2}$ represents the $i^{th}$ row and $i_1^{th}$ through the $j_2^{th}$ columns of $V^{(1)^{-1}}$.

It should be understood that Equation (*) represent a recursive set of expressions to be evaluated in the order specified.

For the above example illustrated in FIG. 4, with the (16, 10) polar code generator matrix 34, the check symbols as illustrated in FIG. 5 are generated from the data symbols 30 as follows:

$$c_{3,4} = c_{3,1} + c_{3,2} + c_{3,3} + c_{4,1} + c_{4,2} + c_{4,3} - c_{4,4},$$

$$c_{2,3} = c_{2,1} + c_{2,2} + c_{4,1} + c_{4,2} - c_{4,3},$$

$$c_{2,4} = c_{2,2} + c_{4,2} - c_{4,4},$$

$$c_{1,2} = c_{1,1} + c_{2,1} - c_{2,2} + c_{3,1} - c_{3,2} + c_{4,1} - c_{4,2},$$

$$c_{1,3} = c_{1,1} + c_{2,1} - c_{2,3} + c_{3,1} - c_{3,3} + c_{4,1} - c_{4,3},$$

$$c_{1,4} = c_{1,1} + c_{2,1} - c_{2,4} + c_{3,1} - c_{3,4} + c_{4,1} - c_{4,4}.$$

With systematic encoding, processor 44 needs only to generate n−k check symbols 32 (see FIG. 1b). The form of the polar code ensures that the operations involved in such check symbol generation are simple, as illustrated above.

Figure 6:
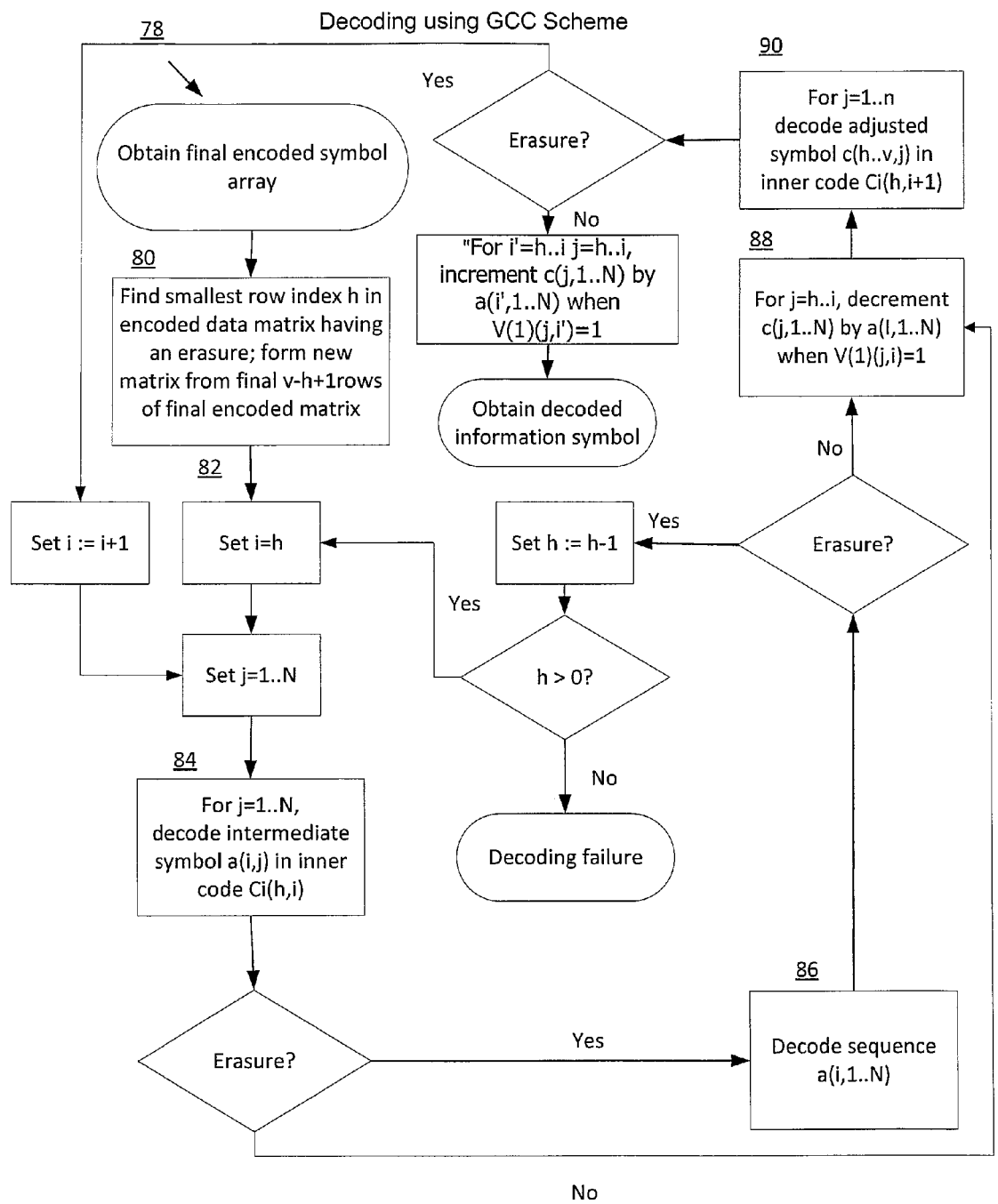
FIG. 6 is a flow chart illustrating an example of decoding using GCC scheme within the electronic environment shown in FIG. 1a and FIG. 1b.

Two decoding schemes, i.e. reconstruction of the payload data in the presence of erasures, which correspond to disk failures, are discussed below. The first scheme employs GCC representation of polar codes and the second scheme is based on Gaussian elimination FIG. 6 illustrates a process 78 of decoding encoded symbols 30 and 32 (see FIG. 1b) that were generated according to the procedure described above to produce final encoded symbol array 70. Process 78 includes steps 80, 82, 84, 86, 88, and 90. Advantageously, process 78 involves a reduced set of decoding operations as compared to the prior art.

In step 80, the smallest row index h in encoded data matrix having an erasure is found. A new matrix $\overline{c_h}$ is then formed from final v−h+1 rows of final encoded matrix 70.

In step 82, an index i←h is set, and a loop over another index j←1 . . . N is initialized. A GCC $C_h$ is constructed that includes a set of inner codes $\mathbb{C}_{h,i}$ and a set of outer) codes $C_i$. Inner code $\mathbb{C}_{h,i}$ has a generator matrix equal to $V^{(1)}_{i\ldots v, h\ldots v}$, while outer code $C_i$ has a generator matrix as described above, where i=h . . . v.

In step 84, a decode operation is performed on columns of $\overline{c_h}$ using inner code $\mathbb{C}_{h,i}$ to produce intermediate symbol $a_{i,j}$. At this point, an erasure may be revealed. If no erasure is revealed, then the process proceeds to step 88, otherwise process proceeds to step 86.

In step 86, a decode operation is performed on intermediate symbols $a_{i,j\ldots N}$ in outer code $C_i$ to recover erased symbols. If this fails, then index h is decremented by one, the index i←h is set, and the loop over the index j←1 . . . N is reinitialized. If no further erasure is revealed, then the process proceeds to step 88.

In step 88, a new loop over the index j←h . . . i is initialized, with j being incremented at each step of the loop. The symbols are decremented according to $c_{j,1...N} \leftarrow c_{j,1...N} - a_{i,1...N}$ when $V_{j,i}^{(1)} = 1$.

In step 90, a decoding operation is performed on the adjusted codeword symbols in inner code $\mathbb{C}_{h,i+1}$. Upon completion of this step, the original data 30 and 32 are recovered so long as there were no failures.

Gaussian elimination represents the maximum likelihood erasure decoding scheme for any linear code. Further details of such a scheme is described below with respect to FIG. 7.

Figure 7:
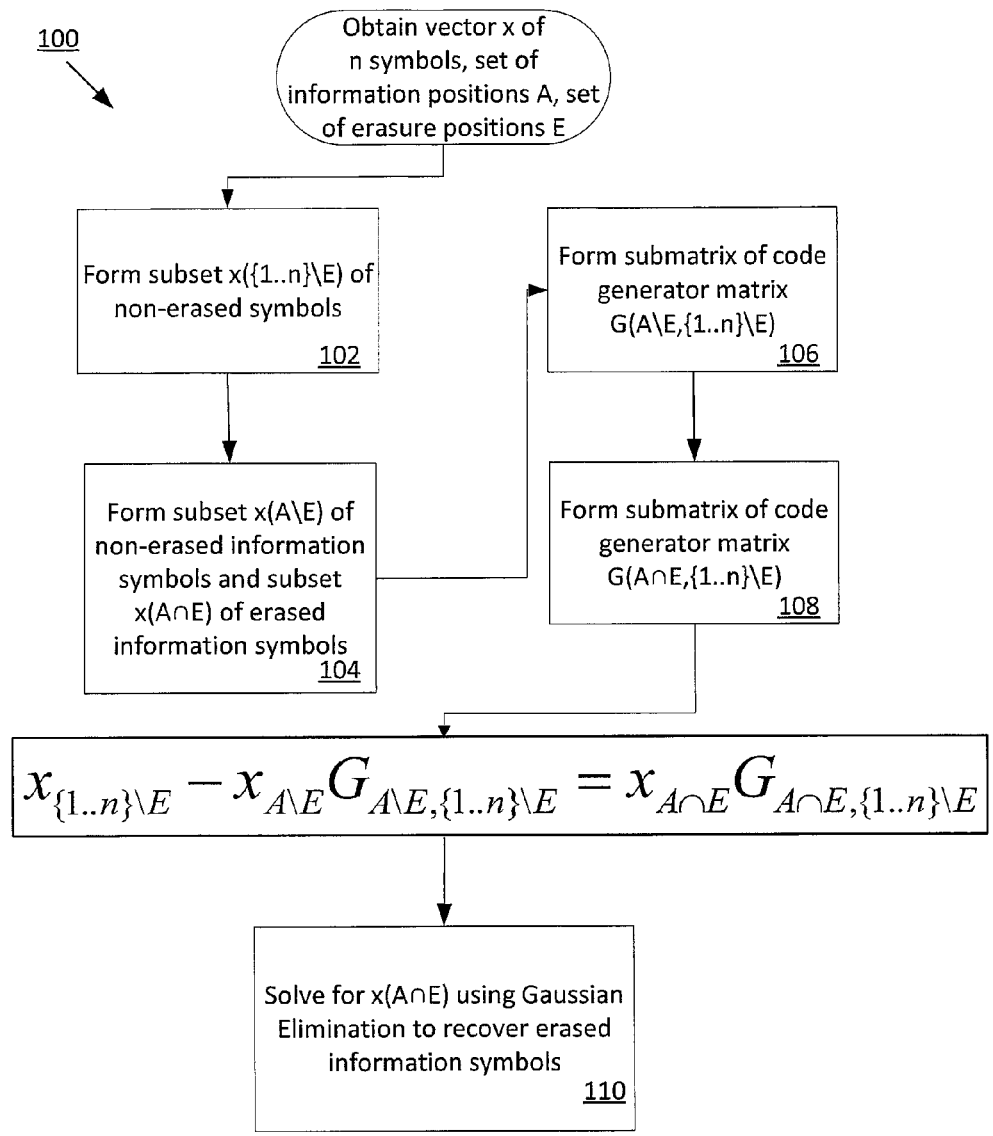
FIG. 7 is a flow chart illustrating an example of decoding using Gaussian elimination within the electronic environment shown in FIG. 1a and FIG. 1b.

FIG. 7 illustrates a process 100 of recovering erased information symbols $x_{A \cap \epsilon}$ for given information positions A and erasure positions $\epsilon$ using a Gaussian elimination scheme in a code having generator matrix G. Process 100 includes steps 102, 104, 106, 108, and 110. (NB a vector of n symbols x has a subvector $x_S$, where $S \subseteq \{1 \ldots n\}$.)

In step 102, a subset of non-erased symbols $x_{\{1 \ldots n\} \backslash \epsilon}$ is formed.

In step 104, a subsets of erased and non-erased information symbols $x_{A \cap \epsilon}$ and $x_{A \backslash \epsilon}$ are formed.

In step 106, a submatrix of generator matrix $G_{A \backslash \epsilon, \{1 \ldots n\} \backslash \epsilon}$ is formed.

In step 108, a submatrix of generator matrix $G_{A \cap \epsilon, \{1 \ldots n\} \backslash \epsilon}$ is formed.

In step 110, the following equation is formed and solved using Gaussian elimination for $x_{A \cap \epsilon}$:

$$x_{\{1 \ldots n\} \backslash \epsilon} - x_{A \backslash \epsilon} G_{A \backslash \epsilon, \{1 \ldots n\} \backslash \epsilon} = x_{A \cap \epsilon} G_{A \cap \epsilon, \{1 \ldots n\} \backslash \epsilon}.$$

In this way, processor 44 can recover erased information symbols.

In some arrangements, processor 44 is configured to perform a partial stripe update operation. This involves changing information symbols within a codeword and corresponding check symbols. Details of partial stripe updating within the systematic encoding described above are described below with respect to FIG. 8.

FIG. 8 illustrates a method 120 of performing a partial stripe update, including steps 122, 124, 126, 128, 130 and 132. In step 122, a set of information symbols to be updated is obtained after generating the v×N matrix of final encoded symbols. In step 124, a difference is produced between a current value of the information symbol and an updated value of the information symbol for each information symbol of the set of information symbols to be updated. In step 126, check symbols are generated for an array having elements that include the difference between a current value of the information symbol and an updated value of the information symbol.

Within the systematic polar coding described above, there are two schemes for achieving such partial stripe updating: by using a generator matrix, and by encoding using GCC representation. To the first effects, in step 128, a generator submatrix is formed from rows of the (n, k) polar code generator matrix corresponding to indices of the set of information symbols to be updated. In step 130, the array of information symbols to be updated is multiplied by a generator submatrix. In step 132, an array of information symbols to be updated by Equation (*) is encoded; values of check symbols are read from disks, difference between these check symbols and values of check symbols from encoding are computed, and this difference is written on the disks.

The second scheme for partial stripe updating includes encoding of an array of information symbols to be updated using Equation (*). Computations are performed only for symbols, which depend on the information symbols, being updated.

The result of multiplication by generator submatrix or of encoding using Equation (*) is values of check symbols. The difference between them and old values of check symbols should be written to the disks with new values of information symbols being updated.

While various embodiments of the invention have been particularly shown and described, it will be understood by those skilled in the art that various changes in form and details may be made therein without departing from the spirit and scope of the invention as defined by the appended claims.

For example, it should be understood that, while the examples described above were directed to arrays of solid-state disks, the improved technique applied to arrays of any other type of disk (e.g., magnetic) arrays.

Further, it should be understood that some embodiments are directed to storage system 14, which is constructed and arranged to reliably store data within a storage system having high-performance, solid-state disks arranged as part of a RAID group having n solid-state disks of which k solid-state disks are payload disks. Some embodiments are directed to a process of reliably storing data within a storage system having high-performance, solid-state disks arranged as part of a RAID group having n solid-state disks of which k solid-state disks are payload disks. Also, some embodiments are directed to a computer program product which enables computer logic to reliably store data within a storage system having high-performance, solid-state disks arranged as part of a RAID group having n solid-state disks of which k solid-state disks are payload disks.

In some arrangements, storage system 14 is implemented by a set of processors or other types of control/processing circuitry running software. In such arrangements, the software instructions can be delivered, within storage system 14, in the form of a computer program product 140 (see FIG. 2), each computer program product having a computer readable storage medium which stores the instructions in a non-volatile manner. Alternative examples of suitable computer readable storage media include tangible articles of manufacture and apparatus such as CD-ROM, flash memory, disk memory, tape memory, and the like.

What is claimed is:

1. A method of reliably storing data within a storage system having high-performance, solid-state disks arranged as part of a RAID group having n solid-state disks of which k solid-state disks are payload disks, k being less than n, the method comprising:

partitioning the payload data into a data vector that includes k data symbols;

applying an (n, k) polar code generator matrix to the payload vector to produce a codeword that includes n encoded symbols, the (n, k) polar code generator matrix including exactly k rows of an n×n matrix that is derived from ⌈$\log_2 n$⌉-times Kronecker product of a 2×2 polar seed matrix with itself, the k rows having indices equal to the indices of the k payload symbols of the data vector; and storing each of the n encoded symbols of the codeword in a solid-state disk of the RAID group.

2. The method of claim 1,
wherein n=$2^s$ for a positive integer s;
wherein applying the (n, k) polar code generator matrix to the payload vector includes:

for a positive integer l, splitting the payload data vector into a set of $v=2^l$ payload data subvectors, the $i^{th}$ payload data subvector for each index i satisfying 1≤i≤v having $k_i$ payload symbols for some positive integer $k_i$ satisfying $\Sigma_{i=1}^{v} k_i = k$, generating, from the (n, k) polar code generator matrix, a set of v outer code generator matrices, the $i^{th}$ outer code generator matrix of the set of v outer code generator matrices for each index i satisfying 1≤i≤v being a (N, $k_i$) polar code generator matrix including exactly $k_i$ rows of the N×N matrix derived from (s–l)-times Kronecker product of the 2×2 polar seed matrix with itself, N being equal to $2^{s-l}$, generating, from the (n, k) polar code generator matrix, (v, v–i+1) inner code generator matrix for each index i satisfying 1≤i≤v being a (v, v–i+1) polar code generator matrix including the (v–i+1) rows of the v×v matrix derived from l-times Kronecker product of the 2×2 polar seed matrix with itself, where v inner codes are nested ones, producing a v×N matrix of intermediate symbols from products of each payload data subvector of the set of v payload data subvectors by a corresponding outer code generator matrix of the set of v outer code generator matrices, and generating a v×N matrix of final encoded symbols from a product of the v×N matrix of intermediate symbols and the first inner code generator matrix of the set of v inner codes generator matrices, the n encoded symbols being the elements of the v×N matrix of final encoded symbols.

3. The method of claim 2, wherein generating the set of v outer codes generator matrices includes:

performing a bit reversal operation on i to produce a bit-reversed index i*;

for each index j satisfying 1≤j≤N:

extracting a row of the N×N matrix derived from (s–l)-times Kronecker product of the 2×2 polar seed matrix having index j* to produce the $j^{th}$ row of the $i*^{th}$ outer code generator of the set of v outer code generators.

4. The method of claim 2, wherein generating the set of v outer code generators includes:

producing a set of indices by which the set of v outer code generator matrices are arranged in an ascending order by value of $k_i$; and wherein generating the v×v inner code generator includes:

multiplying a row swapping matrix and the v×v matrix derived from l-times Kronecker product of the 2×2 polar seed matrix with itself, the row swapping matrix arranging the rows and columns of the v×v inner code matrix according to the set of indices, the v×v inner code generator being an low triangular matrix.

5. The method of claim 4, wherein the set of v outer code generator matrices represents systematic outer codes; and wherein generating the set of v outer code generator matrices further includes:

for each index i satisfying 1≤i≤v:

concatenating a $k_i \times k_i$ identity matrix with a $k_i \times (N-k_i)$ check symbols generation matrix $B^{(i)}$.

6. The method of claim 5, wherein the 2×2 polar seed matrix is $$F = \begin{pmatrix} 1 & 0 \\ 1 & 1 \end{pmatrix},$$

diagonal elements of the first inner code generator matrix having a value of unity, this matrix is low triangular one;

wherein generating the v×N matrix of final encoded symbols, i.e. codeword, includes:

for each index i satisfying 1≤i≤v:

for each index j satisfying 1≤j≤$k_i$:

setting the $(i, j)^{th}$ element of the v×N matrix of final encoded symbols equal to the $j^{th}$ element of the $i^{th}$ payload data subvector; and generating an inverse of the first inner code transposed generator matrix, for each index i satisfying v≥i≥1, and in order of decreasing values of i:

forming a first 1×(v–i+1) subarray of the inverse of the first inner code transposed generator matrix from the $i^{th}$ row and final v–i+1 columns, forming a first (v–i+1)×$k_i$ subarray of the v×N matrix of final encoded symbols from the final v–i+1 rows and first $k_i$ columns of the v×N matrix of final encoded symbols, multiplying the first 1×(v–i+1) subarray of the inverse of the first inner code transposed generator matrix and the first (v–i+1)×$k_i$ subarray of the v×N matrix of final encoded symbols to form a 1×$k_i$ intermediate term, multiplying the 1×$k_i$ intermediate term and the $k_i \times (N-k_i)$ check symbol generation matrix $B^{(i)}$ to form a first 1×$(N-k_i)$ product term, forming a second 1×(v–i) subarray of the inverse of the first inner code transposed generator matrix from the $i^{th}$ row and final v–i columns of the inverse of the first inner code transposed generator matrix, forming a second (v–i)×$(N-k_i)$ subarray of the v×N matrix of final encoded symbols from the final v–i rows and last $N-k_i$ columns, multiplying the second 1×(v–i) subarray of the inverse of the first inner code transposed generator matrix and the second (v–i)×$(N-k_i)$ subarray of the v×N matrix of final encoded symbols to form the second 1×$(N-k_i)$ product term, and setting an array including the final $N-k_i$ elements of the $i^{th}$ row of the v×N matrix of final encoded symbols equal to a difference between a the first 1×$(N-k_i)$ product term and the second 1×$(N-k_i)$ product term.

7. The method of claim 2:

after generating the v×N matrix of final encoded symbols, extracting a set of erased encoded symbols;

producing an initial erasure index h based on the first row of the v×N matrix of final encoded symbols that has an erased final encoded symbol;

forming an outer subset of the final v–h+1 outer code generator matrices of the set of v outer code generator matrices;

forming a set of v–h+1 inner shortened subcode generator matrices, the $i^{th}$ inner shortened subcode generator matrix of the set of v–h+1 inner shortened subcode generator submatrices being a (v–i+1)×(v–h+1) matrix that includes the final v−i+1 rows and the final v−h+1 columns of the first inner code generator matrix, i satisfying h≤i≤v;

for each index i satisfying h≤i≤v:
  performing a decoding operation on a (v−h+1)×N submatrix given by final v−h+1 rows of the v×N matrix of final encoded symbols in the $i^{th}$ inner shortened subcode generator matrices of the set of v−h+1 inner shortened subcode generator matrices to produce a 1×N array of intermediate symbols, and
  performing the decoding operation on the 1×N array of intermediate symbols in the $i^{th}$ outer code of the set of v outer codes to produce a set of decoded intermediate symbols, and
  adjusting the v×N matrix of final encoded symbols by subtraction of decoded 1×N of intermediate symbols from rows of the v×N matrix of final encoded symbols given elements of the $h^{th}$ inner shortened subcode generator matrix, and
  performing a decoding operation on a (v−h+1)×N submatrix given by final v−h+1 rows of the v×N matrix of final encoded symbols in the $(i+1)^{th}$ inner shortened subcode generator matrix of the set of v−h+1.

8. The method of claim 2, further comprising:
performing a decoding operation on the v×N matrix of final encoded symbols using k×n polar code generator matrix, wherein performing the decoding operation includes:
  forming a first generator submatrix from rows of the polar code generator matrix having indices that correspond to the indices of the set of erased information symbols of final encoded symbols,
  forming a second generator submatrix from rows of the polar code generator matrix having indices that correspond to the indices of the set of unerased information symbols of final encoded symbols,
  multiplying a first array that includes unerased information symbols of final encoded symbols and the second generator submatrix to produce a product term,
  forming a second array that includes unerased final encoded symbols, and
  using a Gaussian elimination process to generate an array of erased information symbols, i.e. payload symbol, from i) a difference between the second array and the product term and ii) the first generator submatrix.

9. The method of claim 2, further comprising:
obtaining a set of information symbols to be updated;
for each information symbol of the set of information symbols to be updated, producing a difference between a current value of the information symbol and an updated value of the information symbol; and
generating check symbols for an array having elements that include the difference between a current value of the information symbol and an updated value of the information symbol; and
producing updated values of generated check symbols as the difference between its values and current values of check symbols.

10. The method of claim 9,
wherein generating the check symbols includes:
  forming a generator submatrix from rows of the (n, k) polar code generator matrix corresponding to indices of the set of information symbols to be updated, and
  multiplying an array of information symbols to be updated by the generator submatrix.

11. The method of claim 9,
wherein producing the check symbols includes:
  encoding an array of information symbols to obtain check symbols from encoding,
  reading the current values of the check symbols from the disks,
  computing a difference between the current values of the check symbols and values of the check symbols from encoding, and
  writing the difference on the solid-state disks.

12. An electronic apparatus constructed and arranged to reliably store data within a storage system having high-performance, solid-state disks arranged as part of a RAID group having n solid-state disks of which k solid-state disks are payload disks, k being less than n, the apparatus comprising:
a network interface;
memory; and
a controller coupled to the memory, the controller including controlling circuitry constructed and arranged to:
  partition the payload data into a data vector that includes k data symbols;
  apply an (n, k) polar code generator matrix to the payload vector to produce a codeword that includes n encoded symbols, the (n, k) polar code generator matrix including exactly k rows of an n×n matrix that is derived from $\lceil \log_2 n \rceil$-times Kronecker product of a 2×2 polar seed matrix with itself, the k rows having indices equal to the indices of the k payload symbols of the data vector; and
  store each of the n encoded symbols of the codeword in a solid-state disk of the RAID group.

13. The apparatus of claim 12,
wherein $n=2^s$ for a positive integer s;
wherein applying the (n, k) polar code generator matrix to the payload vector includes:
  for a positive integer l, splitting the payload data vector into a set of $v=2^l$ payload data subvectors, the $i^{th}$ payload data subvector for each index i satisfying 1≤i≤v having $k_i$ payload symbols for some positive integer $k_i$ satisfying $\Sigma_{i=1}^{v} k_i = k$,
  generating, from the (n, k) polar code generator matrix, a set of v outer code generator matrices, the $i^{th}$ outer code generator matrix of the set of v outer code generator matrices for each index i satisfying 1≤i≤v being a (N, $k_i$) polar code generator matrix including exactly $k_i$ rows of the N×N matrix derived from (s−l)-times Kronecker product of the 2×2 polar seed matrix with itself, N being equal to $2^{s-l}$,
  generating, from the (n, k) polar code generator matrix, (v, v−i+1) inner codes generator matrix for each index i satisfying 1≤i≤v being a (v, v−i+1) polar code generator matrix including the (v−i+1) rows of the v×v matrix derived from l-times Kronecker product of the 2×2 polar seed matrix with itself, where v inner codes are nested ones,
  producing a v×N matrix of intermediate symbols from products of each payload data subvector of the set of v payload data subvectors by a corresponding outer code generator matrix of the set of v outer code generator matrices, and
  generating a v×N matrix of final encoded symbols from a product of the v×N matrix of intermediate symbols and the first inner code generator matrix of the set of v inner codes generator matrices, the n encoded symbols being the elements of the v×N matrix of final encoded symbols.

14. The apparatus of claim 13,
wherein generating the set of v outer codes generator matrices includes:
performing a bit reversal operation on i to produce a bit-reversed index i*;
for each index j satisfying $1 \le j \le N$:
extracting a row of the N×N matrix derived from (s-1) Kronecker products of the 2×2 polar seed matrix having index j* to produce the $j^{th}$ row of the $i^{*th}$ outer code generator of the set of v outer code generators.

15. The apparatus of claim 13,
wherein generating the set of v outer code generators includes:
producing a set of indices by which the set of v outer code generator matrices are arranged in an ascending order by value of $k_i$; and
wherein generating the v×v inner code generator includes:
multiplying a row swapping matrix and the v×v matrix derived from l-times Kronecker product of the 2×2 polar seed matrix with itself, the row swapping matrix arranging the rows of the v×v inner code matrix according to the set of indices, the v×v generator matrix of the first inner code being an low triangular matrix.

16. The apparatus of claim 15,
wherein the set of v outer code generator matrices represents systematic outer codes; and
wherein generating the set of v outer code generator matrices further includes:
for each index i satisfying $1 \le i \le v$:
concatenating a $k_i \times k_i$ identity matrix with a $k_i \times (N-k_i)$ check symbol generation matrix $B^{(i)}$.

17. The apparatus of claim 16,
wherein the 2×2 polar seed matrix is $$F = \begin{pmatrix} 1 & 0 \\ 1 & 1 \end{pmatrix},$$

diagonal elements of the first inner code generator matrix having a value of unity, this matrix is low triangular one;
wherein generating the v×N matrix of final encoded symbols, i.e. codeword, includes:
for each index i satisfying $1 \le i \le v$:
for each index j satisfying $1 \le j \le k_i$:
setting the $(i, j)^{th}$ element of the v×N matrix of final encoded symbols equal to the $j^{th}$ element of the $i^{th}$ payload data subvector; and
generating an inverse of the first inner code transposed generator matrix,
for each index i satisfying $v \ge i \ge 1$, and in order of decreasing values of i:
forming a first 1×(v−i+1) subarray of the inverse of the first inner code transposed generator matrix from the $i^{th}$ row and final v−i+1 columns,
forming a first (v−i+1)×$k_i$ subarray of the v×N matrix of final encoded symbols from the final v−i+1 rows and first $k_i$ columns of the v×N matrix of final encoded symbols,
multiplying the first 1×(v−i+1) subarray of the inverse of the first inner code transposed generator matrix and the first (v−i+1)×$k_i$ subarray of the v×N matrix of final encoded symbols to form a 1×$k_i$ intermediate term,
multiplying the 1×$k_i$ intermediate term and the $k_i \times$(N−$k_i$) check symbol generation matrix $B^{(i)}$ to form a first 1×(N−$k_i$) product term,
forming a second 1×(v−i) subarray of the inverse of the first inner code transposed generator matrix from the $i^{th}$ row and final v−i columns of the inverse of the first inner code transposed generator matrix,
forming a second (v−i)×(N−$k_i$) subarray of the v×N matrix of final encoded symbols from the final v−i rows and last N−$k_i$ columns,
multiplying the second 1×(v−i) subarray of the inverse of the first inner code transposed generator matrix and the second (v−i)×(N−$k_i$) subarray of the v×N matrix of final encoded symbols to form the second 1×(N−$k_i$) product term, and
setting an array including the final N−$k_i$ elements of the $i^{th}$ row of the v×N matrix of final encoded symbols equal to a difference between a the first 1×(N−$k_i$) product term and the second 1×(N−$k_i$) product term.

18. The apparatus of claim 13, wherein the controlling circuitry is further constructed and arranged to:
after generating the v×N matrix of final encoded symbols, extracting a set of erased encoded symbols;
producing an initial erasure index h based on the first row of the v×N matrix of final encoded symbols that has an erased final encoded symbol;
forming an outer subset of the final v−h+1 outer code generator matrices of the set of v outer code generator matrices;
forming a set of v−h+1 inner shortened subcode generator matrices, the $i^{th}$ inner shortened subcode generator matrix of the set of v−h+1 inner shortened subcode generator submatrices being a (v−i+1)×(v−h+1) matrix that includes the final v−i+1 rows and the final v−h+1 columns of the first inner code generator matrix, i satisfying $h \le i \le v$;
for each index i satisfying $h \le i \le v$:
performing a decoding operation on a (v−h+1)×N submatrix given by final v−h+1 rows of the v×N matrix of final encoded symbols in the $i^{th}$ inner shortened subcode generator matrices of the set of v−h+1 inner shortened subcode generator matrices to produce a 1×N array of intermediate symbols, and
performing the decoding operation on the 1×N array of intermediate symbols in the $i^{th}$ outer code of the set of v outer codes to produce a set of decoded intermediate symbols, and
adjusting the v×N matrix of final encoded symbols by subtraction of decoded 1×N of intermediate symbols from rows of the v×N matrix of final encoded symbols given elements of the $h^{th}$ inner shortened subcode generator matrix, and
performing a decoding operation on a (v−h+1)×N submatrix given by final v−h+1 rows of the v×N matrix of final encoded symbols in the $(i+1)^{th}$ inner shortened subcode generator matrix of the set of v−h+1.

19. The apparatus of claim 13, wherein the controlling circuitry is further constructed and arranged to:
perform a decoding operation on the v×N matrix of final encoded symbols using k×n polar code generator matrix, wherein performing the decoding operation includes:

forming a first generator submatrix from rows of the polar code generator matrix having indices that correspond to the indices of the set of erased information symbols of final encoded symbols, forming a second generator submatrix from rows of the polar code generator matrix having indices that correspond to the indices of the set of unerased information symbols of final encoded symbols, multiplying a first array that includes unerased information symbols of final encoded symbols and the second generator submatrix to produce a product term, forming a second array that includes unerased final encoded symbols, and using a Gaussian elimination process to generate an array of erased information symbols, i.e. payload symbol, from i) a difference between the second array and the product term and ii) the first generator submatrix.

20. A computer program product having a non-transitory, computer-readable storage medium which stores code for reliably storing data within a storage system having high-performance, solid-state disks arranged as part of a RAID group having n solid-state disks of which k solid-state disks are payload disks, k being less than n, the code including instructions which, when executed by a computer, causes the computer to:

partition the data into a data vector that includes k data symbols;

apply an (n, k) polar code generator matrix to the payload vector to produce a codeword that includes n encoded symbols, the (n, k) polar code generator matrix including exactly k rows of an n×n matrix that is derived from $\lceil \log_2 n \rceil$-times Kronecker products of a 2×2 polar seed matrix with itself, the k rows having indices equal to the indices of the k payload symbols of the data vector; and store each of the n encoded symbols of the codeword in a solid-state disk of the RAID group.

* * * * *